US007202722B2

(12) United States Patent
Mahadevan et al.

(10) Patent No.: US 7,202,722 B2
(45) Date of Patent: Apr. 10, 2007

(54) DUTY-CYCLE CORRECTION CIRCUIT

(75) Inventors: Raj Mahadevan, Toronto (CA); Tony Pialis, Toronto (CA)

(73) Assignees: Agere System Inc., Allentown, PA (US); Snowbush Inc., Toronto, Ontario (CA)

(*) Notice: Subject to any disclaimer, the term of this patent is extended or adjusted under 35 U.S.C. 154(b) by 17 days.

(21) Appl. No.: 11/129,996

(22) Filed: May 16, 2005

(65) Prior Publication Data

US 2005/0253637 A1 Nov. 17, 2005

Related U.S. Application Data

(60) Provisional application No. 60/571,733, filed on May 17, 2004.

(51) Int. Cl.
*H03K 3/017* (2006.01)
(52) U.S. Cl. .................................. 327/175; 327/291
(58) Field of Classification Search ................. 327/175
See application file for complete search history.

(56) References Cited

U.S. PATENT DOCUMENTS

| 4,533,876 A | | 8/1985 | Haque et al. ............. 330/253 |
| 4,906,943 A | | 3/1990 | Koch ......................... 330/258 |
| 4,933,644 A | | 6/1990 | Fattaruso et al. ......... 330/258 |
| 5,572,158 A | * | 11/1996 | Lee et al. .................. 327/175 |
| 6,812,750 B1 | * | 11/2004 | Henrion et al. ........... 327/115 |
| 6,897,700 B1 | * | 5/2005 | Fu et al. .................... 327/307 |
| 6,967,514 B2 | * | 11/2005 | Kizer et al. ................ 327/175 |
| 7,015,739 B2 | * | 3/2006 | Lee et al. .................. 327/175 |
| 2004/0189363 A1 | * | 9/2004 | Takano ...................... 327/175 |

OTHER PUBLICATIONS

"A 1GHz 1.8v Monolithic CMOS PLL With Improved Locking," by Jian Zhou and Huiting Chen, 0-7803-7150-X, IEEE, 2001, pp. 458-461.
"A 50% Duty-Cycle Correction Circuit For PLL Output," by Toru Ogawa and Kenji Taniguchi, 0-7803-7448-7/02, IEEE, 2002, pp. VI 21-24.

* cited by examiner

*Primary Examiner*—Long Nguyen
*Assistant Examiner*—Ryan Jager

(57) ABSTRACT

A duty-cycle correction (DCC) circuit adapted to adjust the duty cycle of a differential clock signal to conform it to the requirements of a half-rate clocking system. In a representative embodiment, the DCC circuit has a buffer circuit adapted to generate a differential output clock signal by adding offset voltage to a differential input clock signal. A feedback loop coupled to the buffer circuit processes the output clock signal to evaluate deviation of its duty-cycle value from 50% and, based on the evaluation, configures the buffer circuit to adjust the offset voltage such that the duty-cycle deviation is reduced. The feedback loop and the buffer circuit are controlled by a duty-cycle calibration engine, e.g., a digital logic circuit adapted to determine an appropriate value for the offset voltage, which causes the duty-cycle value in the output clock signal to be substantially 50% regardless of the duty-cycle value in the input clock signal. As a result, technological limitations in the circuit-fabrication process do not significantly reduce the yield of chips for half-rate clocking systems.

22 Claims, 9 Drawing Sheets

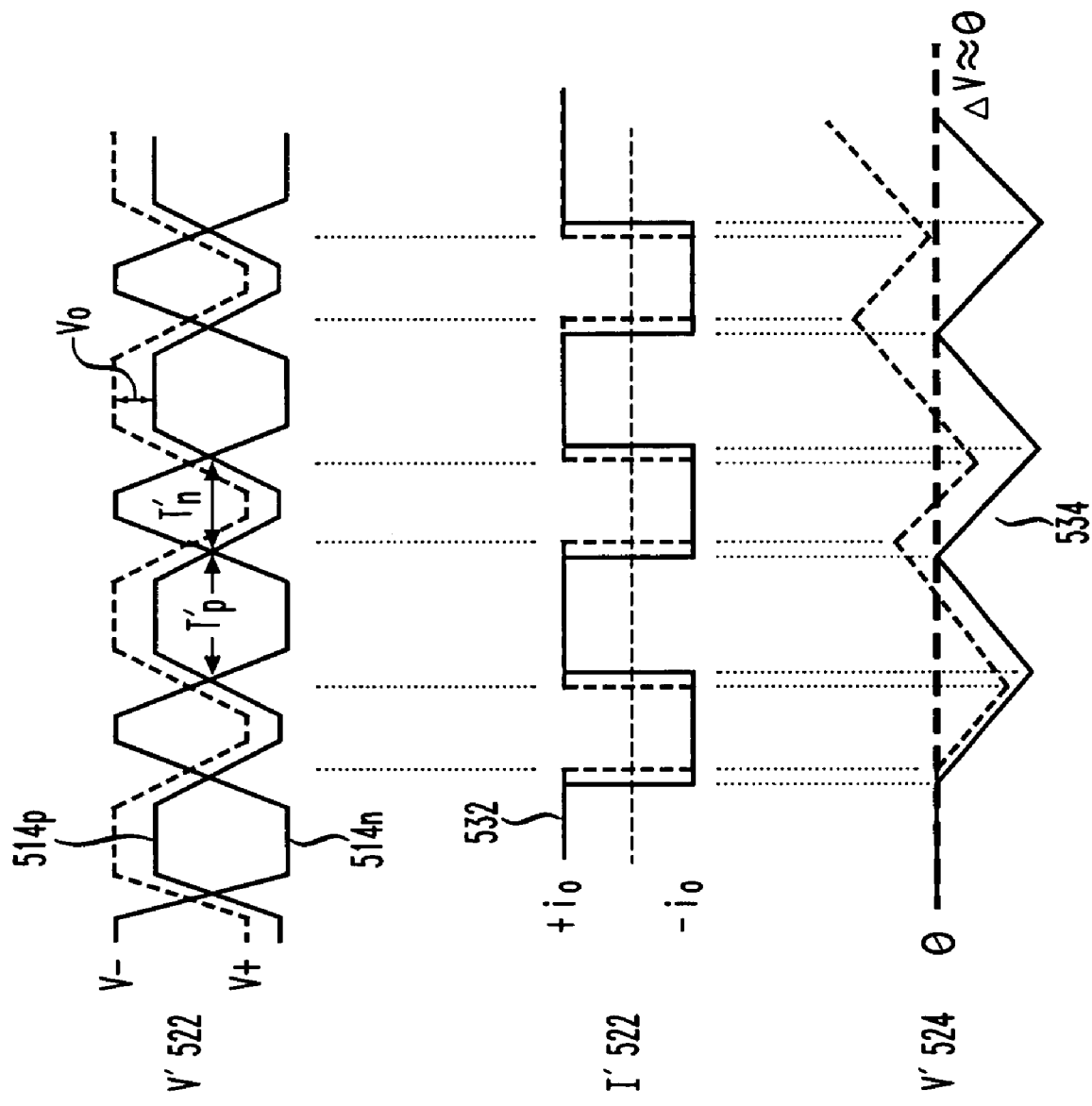

DUTY-CYCLE CORRECTION CIRCUIT

CROSS-REFERENCE TO RELATED APPLICATIONS

This application claims the benefit of the filing date of U.S. provisional application No. 60/571,733, filed on May 17, 2004, the teachings of which are incorporated herein by reference.

BACKGROUND OF THE INVENTION

1. Field of the Invention

The present invention relates to electronics and, in particular, to clock-signal generating circuits.

2. Description of the Related Art

FIG. 1 shows a block diagram of a phase-locked loop (PLL) 100 of the prior art. PLL 100 includes a phase detector 102, a loop filter 104, a voltage-controlled oscillator (VCO) 106, and a feedback path having a frequency divider 108. A periodic reference signal 110 of frequency $F_{ref}$ is fed to phase detector 102 together with feedback signal 112 (the output of frequency divider 108). The output of phase detector 102 is a pulse that is related to the phase difference between reference signal 110 and feedback signal 112. The output of phase detector 102 is filtered through loop filter 104 and fed to VCO 106. Due to the feedback in the PLL, the frequency $F_{out}$ of output signal 114 of VCO 106 is driven to equal the reference frequency $F_{ref}$ multiplied by the division factor of frequency divider 108, thereby resulting in a relatively high frequency of the output signal. Output signal 114 is typically a differential signal having two differential components.

One application of PLL 100 is to provide a reference clock signal, e.g., for a microprocessor or communication circuit. For this particular application, it is often desirable to design PLL 100 such that output signal 114 has a 50% duty cycle. In a 50% duty-cycle clock signal, the time interval between a positive transition edge and a negative transition edge is equal to the time interval between that negative transition edge and the next positive transition edge. In other words, all transition edges, regardless of the transition-edge direction, are equally spaced, which enables a half-rate (double-edge) clocking system. In contrast, in a clock signal having a duty cycle different from 50%, the time interval between a positive transition edge and a negative transition edge is different from the time interval between the negative transition edge and the next positive transition edge. Consequently, only one transition edge per cycle can be utilized as a valid reference point, which is known as a full-rate (single-edged) clocking system. Advantageously, a half-rate clocking system eases circuit design constraints compared to those of a full-rate clocking system because it effectively doubles the clock rate without having to double the corresponding VCO frequency.

PLL 100 is usually incorporated into a relatively large integrated circuit (chip) and manufactured using a suitable fabrication process, e.g., CMOS. However, technological limitations of the fabrication process often cause the duty cycle of PLL 100 to vary from chip to chip and deviate from the intended 50%. Due to relatively strict tolerances of certain half-rate clocking systems, a significant percentage of manufactured chips falls outside the acceptable duty-cycle range and has to be discarded.

SUMMARY OF THE INVENTION

Problems in the prior art are addressed, in accordance with the principles of the present invention, by a duty-cycle correction (DCC) circuit adapted to adjust the duty cycle of a differential clock signal to conform it to the requirements of a half-rate clocking system. In a representative embodiment, the DCC circuit has a buffer circuit adapted to generate a differential output clock signal by adding offset voltage to a differential input clock signal. A feedback loop coupled to the buffer circuit processes the output clock signal to evaluate deviation of its duty-cycle value from 50% and, based on the evaluation, configures the buffer circuit to adjust the offset voltage such that the duty-cycle deviation is reduced. The feedback loop and the buffer circuit are controlled by a duty-cycle calibration engine, e.g., a digital logic circuit adapted to determine an appropriate value for the offset voltage, which causes the duty-cycle value in the output clock signal to be substantially 50% regardless of the duty-cycle value in the input clock signal. As a result, technological limitations in the circuit-fabrication process do not significantly reduce the yield of chips for half-rate clocking systems.

BRIEF DESCRIPTION OF THE DRAWINGS

Other aspects, features, and benefits of the present invention will become more fully apparent from the following detailed description, the appended claims, and the accompanying drawings in which:

FIGS. 6A–F graphically illustrate the principles of operation of a feedback loop in the DCC circuit of FIG. 5 according to one embodiment of the present invention;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

Figure 1:
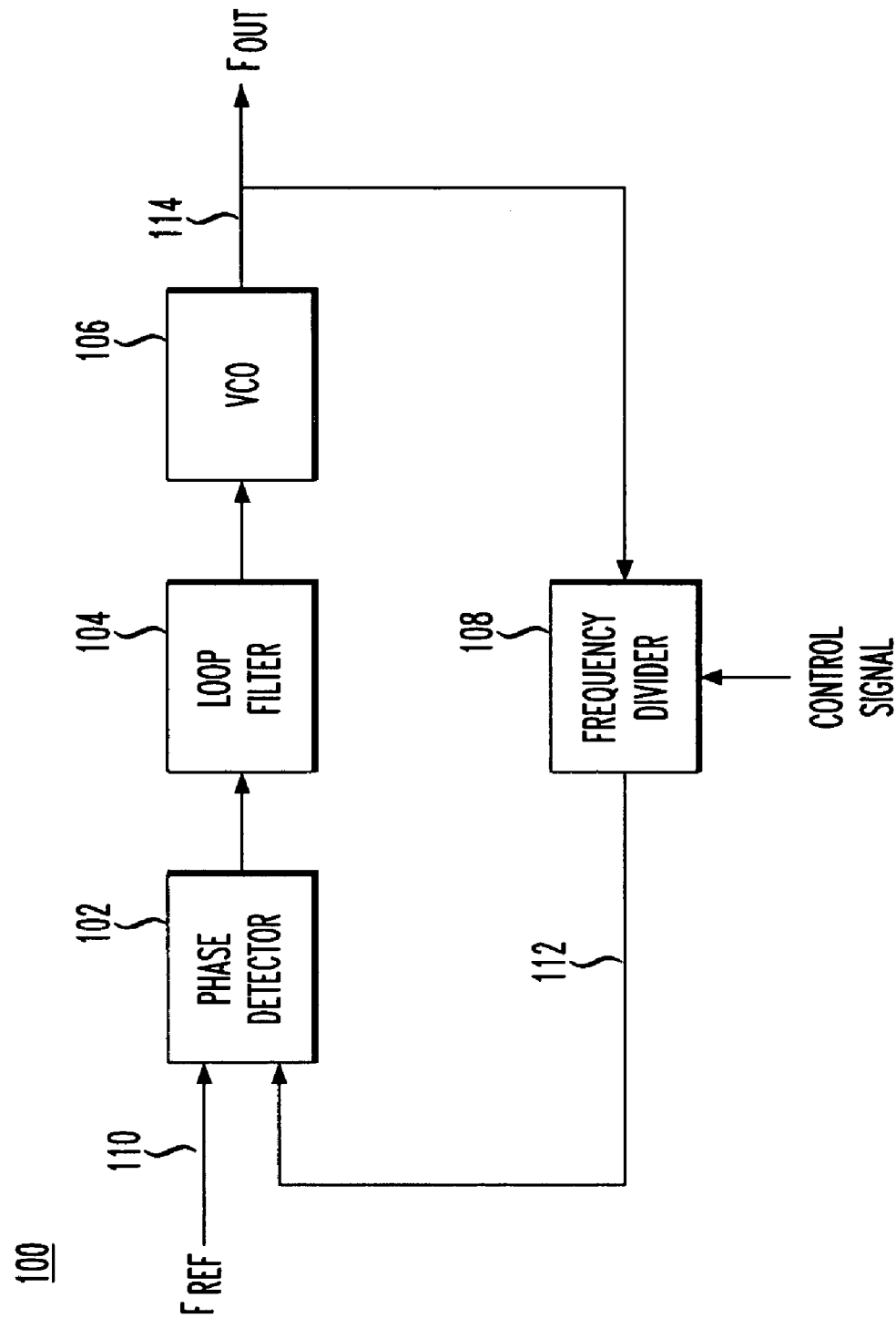
FIG. 1 shows a block diagram of a phase-locked loop (PLL) of the prior art.
Figure 2:
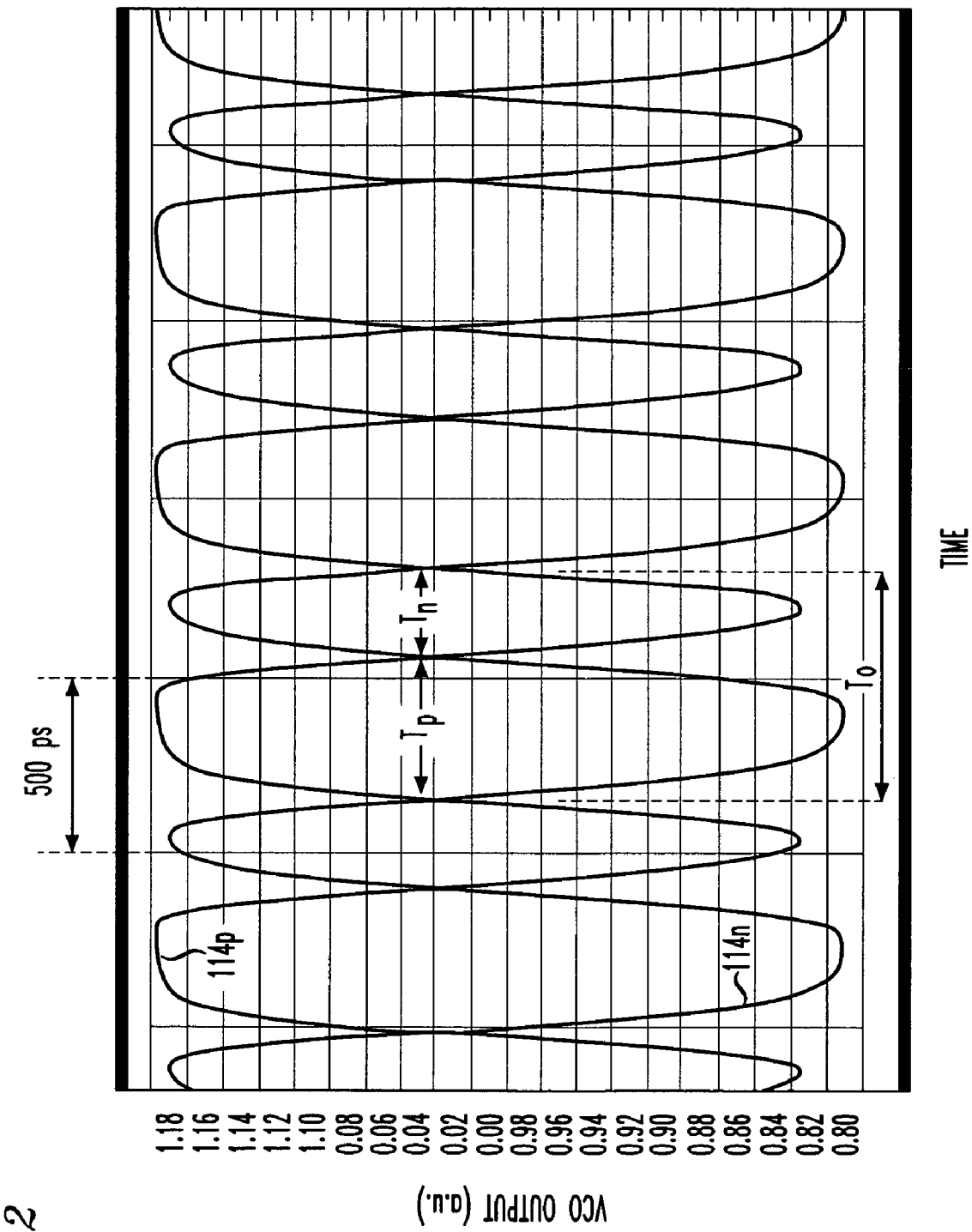
FIG. 2 graphically shows a representative output signal of the PLL shown in FIG. 1.

FIG. 2 graphically shows representative differential output signal 114 of PLL 100 (FIG. 1). Signal 114 is characterized by a period $T_0$ and has two components 114p and 114n. Within each cycle of signal 114, signal 114p is greater than signal 114n for a time interval $T_p$, and signal 114n is greater than signal 114p for a time interval $T_n$, where $T_p+T_n=T_0$. The duty cycle of signal 114 is determined, e.g., by the value of $T_p/T_0$, and is 50% when $T_p/T_0=T_n/T_0=0.5$. In signal 114 shown in FIG. 2, the duty cycle is about 62% and the deviation of the duty cycle from 50% is about 95 ps. As explained above, the deviation may be caused by imperfections in the fabrication process.

Figure 3:
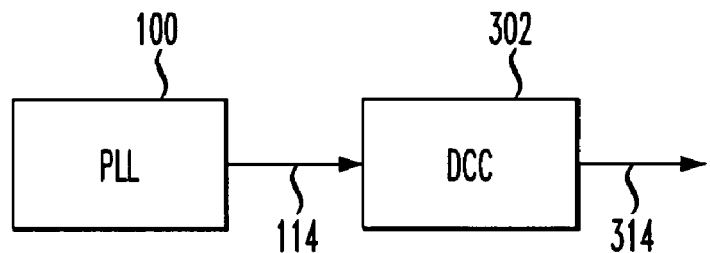
FIG. 3 shows a block diagram of a clock circuit according to one embodiment of the present invention.

FIG. 3 shows a block diagram of a clock circuit 300 according to one embodiment of the present invention. Clock circuit 300 has a duty-cycle correction (DCC) circuit 302 coupled to the output of PLL 100 of FIG. 1. DCC circuit 302 receives differential signal 114, e.g., that shown in FIG. 2, and generates a differential signal 314 having a substantially 50% duty cycle, which can then be used in a half-rate clocking system. DCC circuit 302 is designed such that it is capable of correcting the duty cycle of signal 114 falling within a relatively wide range, e.g., from 30% to 70%. As a result, technological limitations in the fabrication process of clock circuit 300 have insignificant adverse effect on the duty cycle of signal 314.

Figure 4:
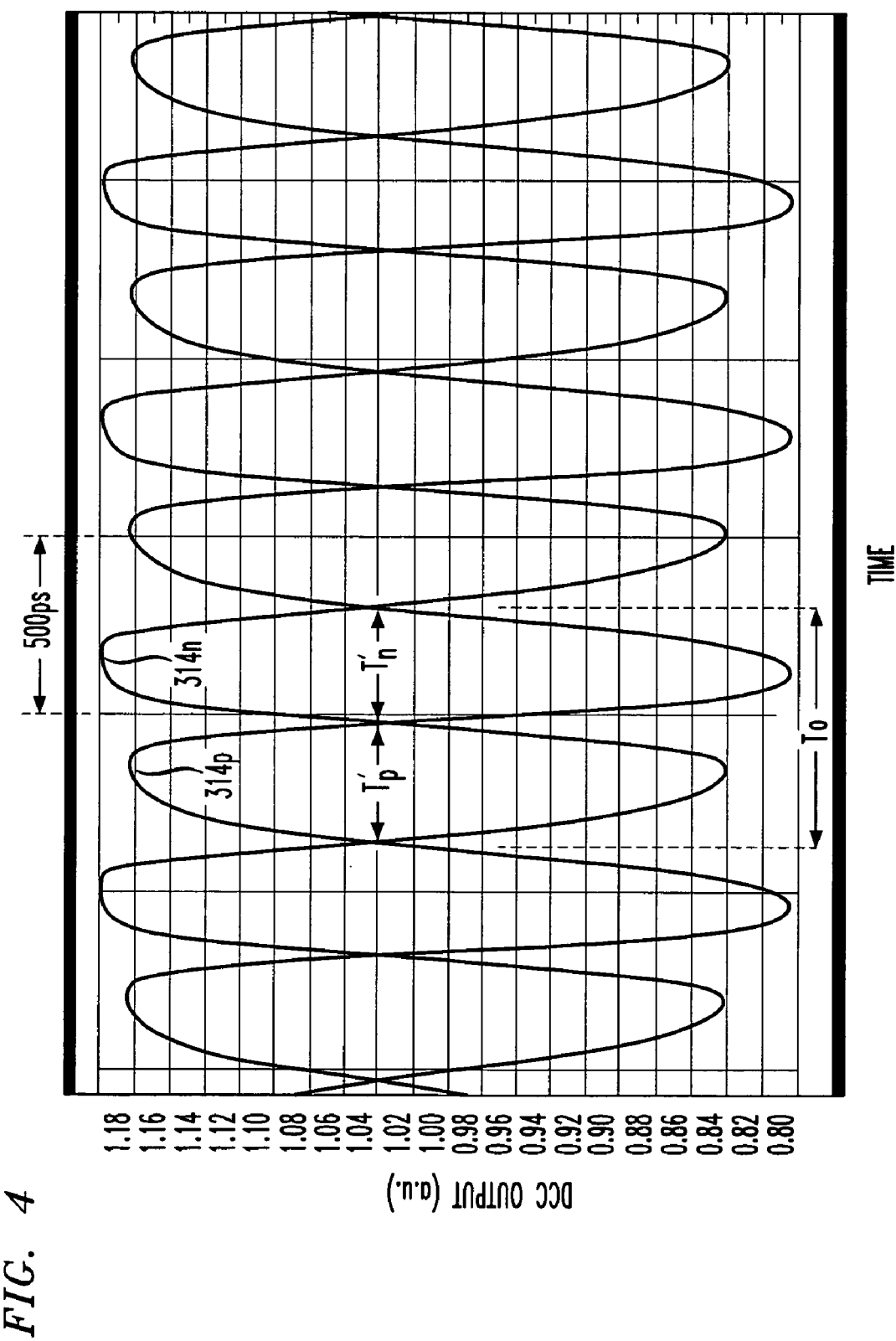
FIG. 4 graphically shows a representative output signal of the clock circuit shown in FIG. 3.

FIG. 4 graphically shows a representative differential signal 314 generated by DCC circuit 302 based on differential signal 114 shown in FIG. 2. Similar to signal 114, signal 314 is characterized by the same period $T_0$ and has two components 314p and 314n. However, in signal 314, the values of $T_p$ and $T_n$ are adjusted to become $T'_p$ and $T'_n$, respectively, such that $T_p'/T_0 \approx T_n'/T_0 \approx 0.5$. Consequently, the duty cycle of signal 314 is substantially 50%.

In one embodiment, DCC circuit 302 performs duty-cycle correction as follows. Suppose that, for signal 114 received by DCC circuit 302, $T_p>T_n$ as illustrated in FIG. 2. DCC circuit 302 then generates signals 314n and 314p by adding an offset voltage between signals 114n and 114p and transferring the offset signals to the output. As can be seen in FIG. 2, a positive offset (i.e., an upward shift) of signal 114n with respect to signal 114p will cause an increase in the value of $T_n$ while causing a corresponding decrease in the value of $T_p$. DCC circuit 302 selects the offset voltage such that the adjusted values $T'_p$ and $T'_n$ become substantially equal to each other as shown in FIG. 4. Similarly, when $T_p<T_n$, DCC circuit 302 negatively offsets (i.e., shifts downward) signal 114n with respect to signal 114p until $T'_p \cong T'_n$.

Figure 5:
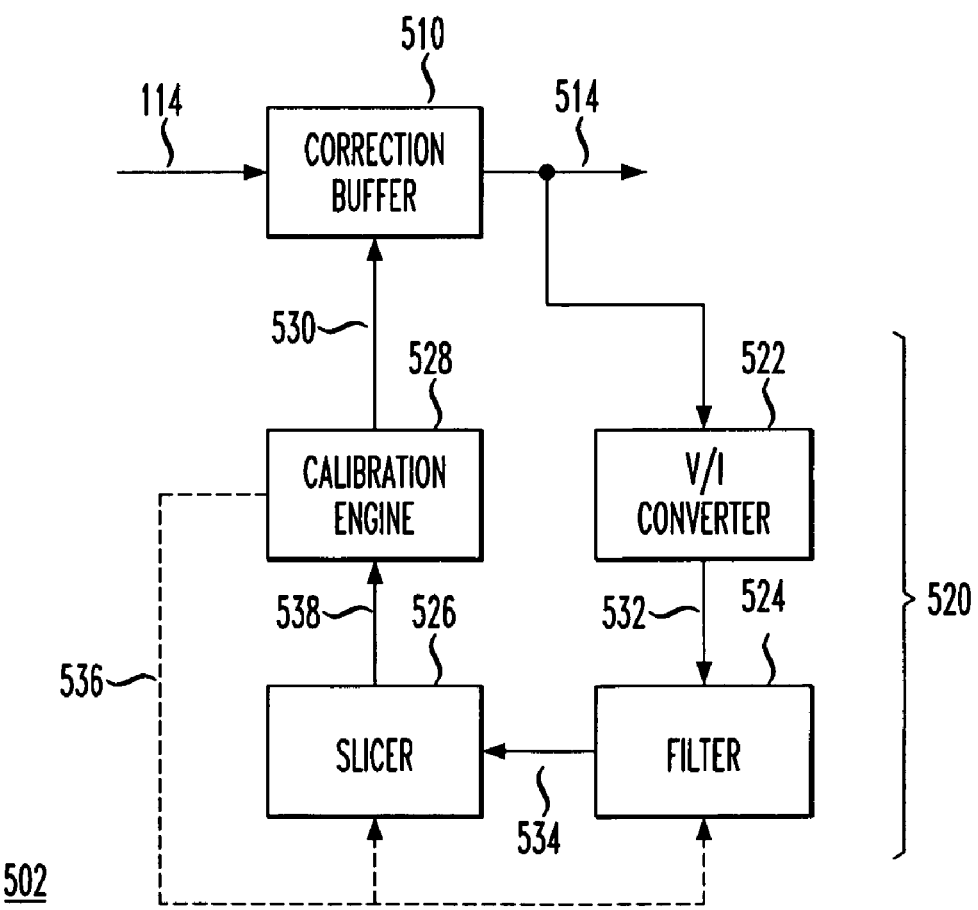
FIG. 5 shows a block diagram of a duty-cycle correction (DCC) circuit that can be used in the clock circuit of FIG. 3 according to one embodiment of the present invention.

FIG. 5 shows a block diagram of a DCC circuit 502 that can be used as DCC circuit 302 according to one embodiment of the present invention. DCC circuit 502 has a correction buffer 510 and a feedback loop 520. Based on a control signal 530 generated by feedback loop 520, correction buffer 510 offsets the components of a differential input signal, e.g., of differential signal 114 applied to DCC circuit 502, with respect to each other to generate a differential output signal 514 having a substantially 50% duty cycle. A portion of output signal 514 is processed by feedback loop 520, which then configures correction buffer 510, via control signal 530, to reduce possible deviations from 50% in the duty cycle of the output signal. In one embodiment, control signal 530 is a digital control signal representing, in a digital format, the offset voltage added to differential signal 114 by correction buffer 510.

In one embodiment, DCC circuit 502 is adapted to operate in two different operational modes, a calibration mode and a tracking mode. In the calibration mode, DCC circuit 502 performs an initial calibration of differential signal 114, e.g., at the circuit power-up, and then locks the offset voltage value determined during that initial calibration for use, without any further changes, during the subsequent circuit operation, e.g., until the circuit power-down. This mode is useful, for example, when differential signal 114 is relatively stable, i.e., has a relatively stable value of its duty cycle. In contrast, in the tracking mode, DCC circuit 502 performs an initial calibration of differential signal 114, e.g., similar to that performed during the calibration mode, but does not lock the offset voltage value determined during the initial calibration. Instead, DCC circuit 502 continues to track differential signal 514 for possible deviations of its duty cycle from 50%. Based on the tracking, control signal 530 and, thus the offset voltage value, are continuously (or intermittently/periodically) adjusted to maintain the duty-cycle value of differential signal 514 at substantially 50%. The tracking mode is useful, for example, when the duty cycle of differential signal 114 is subject to fluctuations, e.g., due to a thermal drift in PLL 100.

Feedback loop 520 includes a voltage-to-current (V/I) converter 522, a signal filter 524, a slicer 526, and a duty-cycle calibration engine 528, a functional description of each of which is provided below in the context of FIG. 6. In a preferred embodiment, V/I converter 522, signal filter 524, and slicer 526 are implemented using analog circuitry, while calibration engine 528 is implemented in a digital logic circuit adapted to control the operations of both feedback loop 520 and correction buffer 510. More specifically, calibration engine 528 receives a signal 538 from slicer 526 and generates control signals 530 and 536. Signal 538 provides a measure of duty-cycle deviation from 50% in differential signal 514 and control signal 530 configures correction buffer 510 to change the offset voltage such that the duty-cycle deviation from 50% in differential signal 514 is reduced. Control signal 536 controls operations of signal filter 524 and slicer 526 as described in more detail below.

Figures 6A, 6B, 6C:
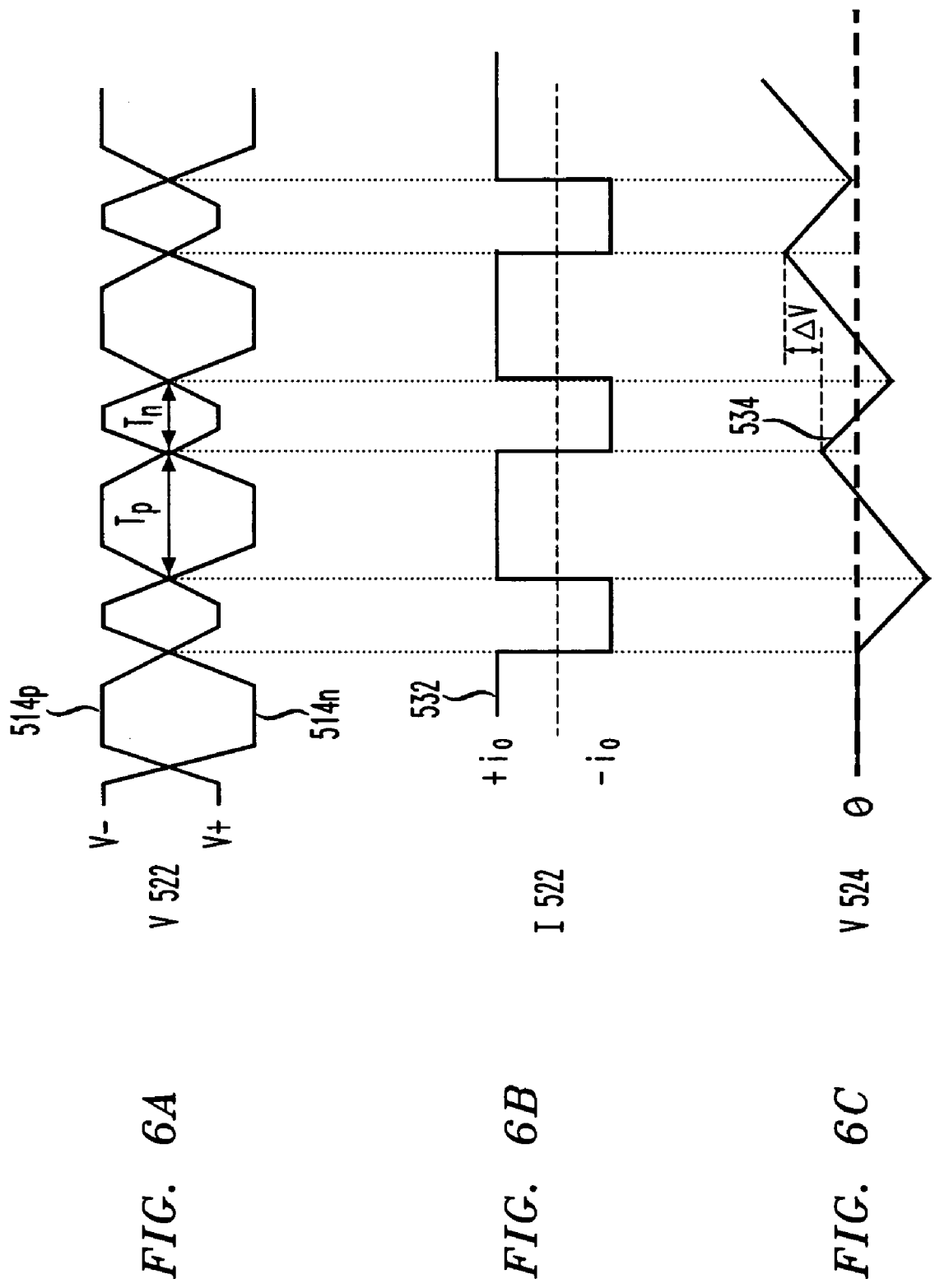

FIGS. 6A–F graphically illustrate the principles of operation of feedback loop 520 (FIG. 5) according to one embodiment of the present invention. More specifically, FIGS. 6A–C show various signals in feedback loop 520 at the beginning of a duty-cycle correction process, and FIGS. 6D–F show those various signals after the duty cycle has been corrected.

FIGS. 6A–B graphically show the initial input and output signals of V/I converter 522, e.g., at the circuit power-up. The offset voltage corresponding to FIGS. 6A–B is substantially zero and, consequently, signals 514p and 514n are substantially the same as signals 114p and 114n, respectively. As a result, $T_p \ne T_n$ and the duty cycle of signal 514 deviates from 50%. Based on signals 514p and 514n, V/I converter 522 generates a signal 532 shown in FIG. 6B. Signal 532 is a square-wave alternating current signal, which switches between a positive rail $+i_0$ and a negative rail $-i_0$. More specifically, signal 532 switches polarity when the difference between signals 514p and 514n changes sign. For example, when signal 514p is greater than signal 514n, signal 532 is at the positive rail. Similarly, when signal 514n is greater than signal 514p, signal 532 is at the negative rail.

Signal filter 524 processes signal 532 as follows. Signal filter 524 includes an integrator (not shown in FIG. 5) adapted to generate an output signal 534 (see FIG. 5) by integrating signal 532. As seen in FIG. 6C, signal 534 is an alternating ramp signal, which ramps up or down as signal 532 alternates between the positive and negative rails, respectively. Before the integration begins, signal filter 524 is reset by control signal 536 such that the value of signal 534 is zero. After the integration begins, signal 534 goes up and down as indicated in FIG. 6C. However, because $T_p \ne T_n$, at the end of each cycle, signal 534 accumulates an increment of $\Delta V=i_0(T_p-T_n)$. In the particular situation illustrated in FIGS. 6A–C, $T_p>T_n$, the value of $\Delta V$ is positive, and signal 534 on average ramps up. Similarly, when $T_p<T_n$, signal 534 will on average ramp down. Control signal 536 (FIG. 5) sets the length of the integration period in signal filter 524. In general, if the value of $\Delta V$ is relatively small, a relatively long integration period is typically needed for a sufficiently large cumulative increment to accrue. At the end of the integration period, control signal 536 configures slicer 526 to evaluate signal 534 and provide the evaluation result to calibration engine 528 via signal 538. The evaluation result may, for example, be the polarity of signal 534. Based on signal 538, calibration engine 528 generates control signal 530, which configures correction buffer 510 (FIG. 5) to add a corresponding offset voltage to signal 114.

FIGS. 6D–F graphically show the operation of feedback loop 520 after a proper offset voltage $V_0$ has been introduced into differential signal 114. More specifically, the dashed traces in FIGS. 6D–F indicate the initial signals in feedback loop 520 shown in FIGS. 6A–C, respectively, and the solid traces in FIGS. 6D–F show the updated signals in the feedback loop after the proper offset voltage has been added. Referring to FIG. 6D, signals 514$p$ and 514$n$ are shifted with respect to each other by offset voltage $V_0$, which results in new values for $T_p$ and $T_n$ labeled $T'_p$ and $T'_n$, respectively, where $T'_p$ is substantially equal to $T'_n$. Referring to FIG. 6E, due to the change in the values of $T_p$ and $T_n$ shown in FIG. 6D, time for signal 532 at the positive rail decreases compared to that shown in FIG. 6B while time at the negative rail increases by the corresponding amount. As a result, $\Delta V$ is substantially zero and signal 534 on average does not ramp up or down (see FIG. 6F). Consequently, calibration engine 528 generates control signal 530, which configures correction buffer 510 to keep the offset voltage at $V_0$. As can be appreciated by one skilled in the art, signal 514 shown in FIG. 6D has the desired duty-cycle value of substantially 50%.

Figure 7:
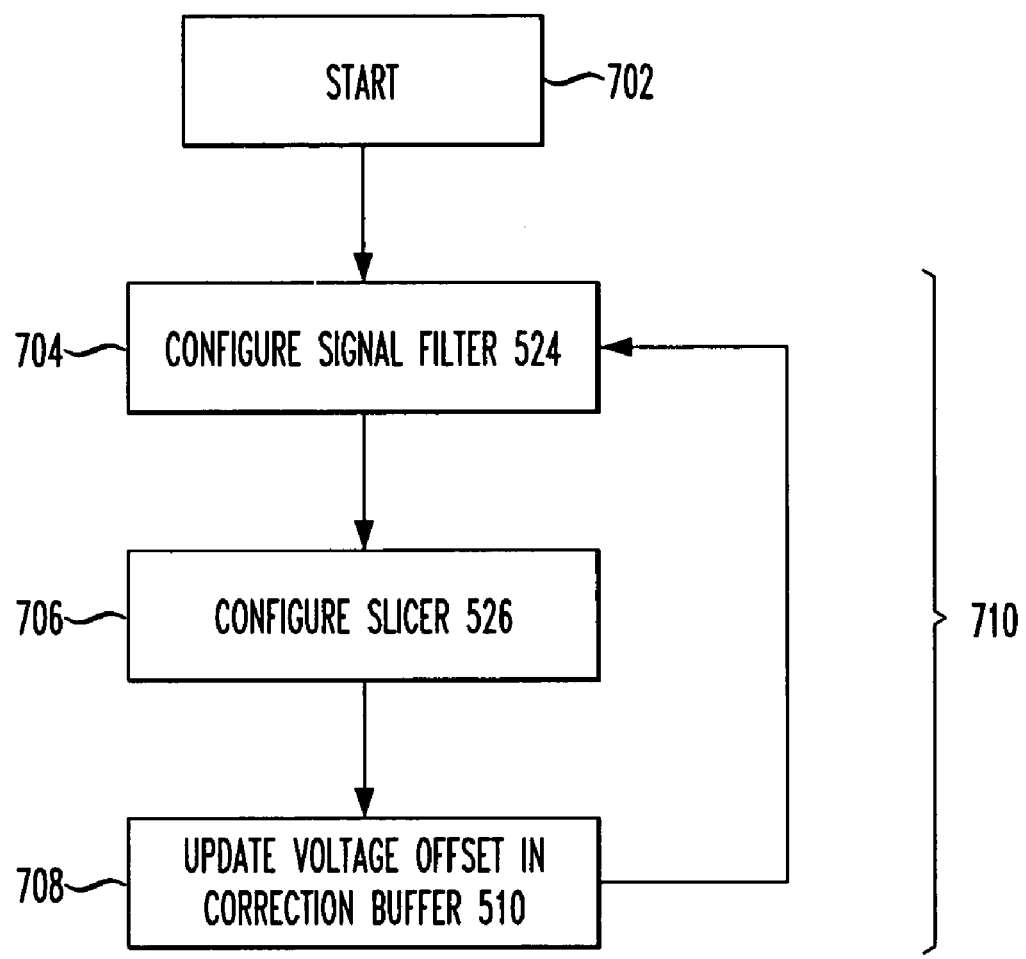
FIG. 7 shows a flowchart of a method that is used to operate a duty-cycle calibration engine in the DCC circuit of FIG. 5 according to one embodiment of the present invention.

FIG. 7 shows a flowchart of a method 700 that is used to operate calibration engine 528 according to one embodiment of the present invention. More specifically, method 700 corresponds to a tracking mode of operation of DCC circuit 502. In step 702, when DCC circuit 502 is turned on, calibration engine 528 resets correction buffer 510 such that the offset voltage is zero. In step 704, calibration engine 528 configures signal filter 524 to set signal 534 to zero and to start integration of signal 532. Calibration engine 528 preferably proceeds to step 706 after allowing signal filter 524 to integrate signal 532 for N signal cycles, where N>1. In a representative configuration, N=256. In step 706, calibration engine 528 configures slicer 526 to slice signal 534 to determine the sign of $\Delta V$ (see also FIG. 6C) and to provide that information to the calibration engine via signal 538. In one implementation, signal 538 is a binary signal generated as follows. When the value of signal 532 is greater than or equal to zero, signal 538 is a binary "one". Similarly, when the value of signal 532 is less than zero, signal 538 is a binary "zero". In step 708, calibration engine 528, via control signal 530, configures correction buffer 510 to increment the offset voltage by an increment amount, $v_{inc}$, in the direction corresponding to the sign of $\Delta V$ determined in step 706. For example, when signal 538 is a binary "one", control signal 530 configures correction buffer 510 to increment the offset voltage by $+v_{inc}$, thereby reducing the duty cycle of signal 514 by a corresponding amount (see also FIG. 6D). Similarly, when signal 538 is a binary "zero", control signal 530 configures correction buffer 510 to increment the offset voltage by $-v_{inc}$, thereby increasing the duty cycle of signal 514. Preferably, the value of $v_{inc}$ is relatively small, e.g., 2 mV, to permit fine-tuning of the duty cycle. After step 708, the processing of method 700 returns to step 704. Steps 704–708 form a processing loop 710, which is used to dynamically control the duty cycle of signal 514.

Figure 8:
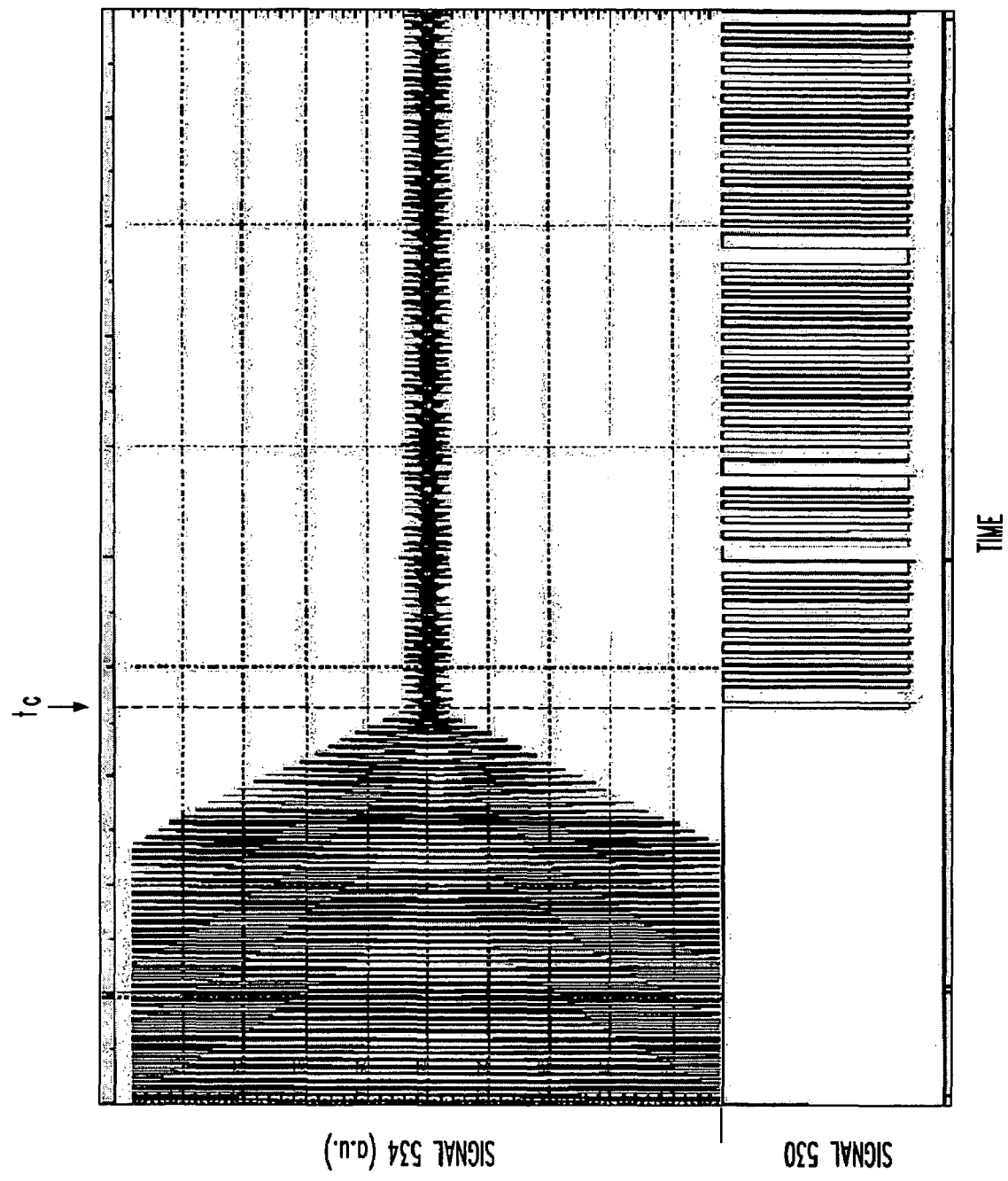
FIG. 8 graphically shows representative signals in the DCC circuit of FIG. 5 when that circuit is configured to operate in accordance with the method of FIG. 7.

FIG. 8 graphically shows signals 534 and 530 when DCC circuit 502 is configured to operate in accordance with method 700. More specifically, FIG. 8 shows a time interval during which calibration engine 528 cycles through processing loop 710 of method 700 about 170 times. About 60 initial processing loops 710 correspond to the initial conversion of DCC circuit 502 toward the desired duty-cycle value of 50% from an initial duty-cycle value that has a relatively large positive deviation from 50%. Until such conversion is achieved at time $t_c$, the accumulated increment at the end of each processing loop 710 (i.e., step 708) in signal 534 is relatively large (see the top panel of FIG. 8). Consequently, the value of signal 530 (see the bottom panel of FIG. 8) at the end of each processing loop 710 is such that correction buffer 510 keeps adding positive increments to the offset voltage, thereby decreasing the duty-cycle value in signal 514 and eventually decreasing the accumulated increment in signal 534 as indicated in the top panel of FIG. 8. At time $t_c$, the offset voltage becomes large enough to cause the duty-cycle value to cross the 50% mark, i.e., to become less than 50%. As a result, calibration engine 528 changes the value of signal 530 (see the bottom panel of FIG. 8) to configure correction buffer 510 to subtract an increment amount from the offset voltage, thereby increasing the duty-cycle value in signal 514 and causing it to become again greater than 50%. After that point in time, the value of control signal 530 begins to alternate between the two values (see the bottom panel of FIG. 8) and, as a result, the offset voltage begins to alternate between two levels, e.g., $V_+$ and $V_-$, where $|V_+-V_-|=v_{inc}$. offset voltage has a value of $V_+$, the duty-cycle value in signal 514 is slightly larger than 50%. Similarly, when the offset voltage has a value of $V_-$, the duty-cycle value in signal 514 is slightly smaller than 50%. When $v_{inc}$ has an appropriately small value, deviations of the duty-cycle in signal 514 from 50% are relatively small, e.g., such that signal 514 is suitable for use in a half-rate clocking system.

Figure 9:
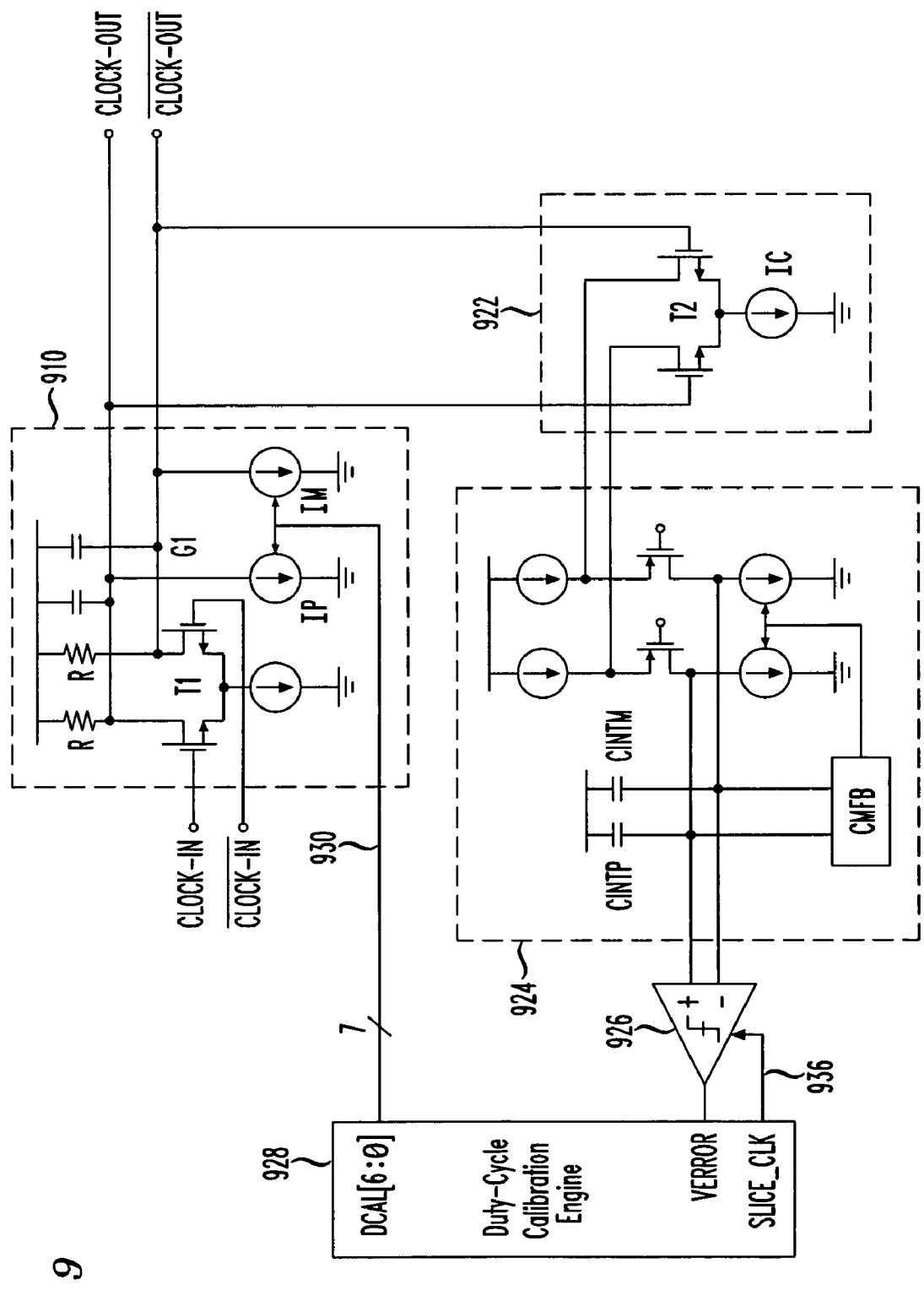
FIG. 9 shows a diagram of a DCC circuit that can be used in the clock circuit of FIG. 3 according to another embodiment of the present invention.

FIG. 9 shows a diagram of a DCC circuit 902 that can be used in the clock circuit of FIG. 3 according to another embodiment of the present invention. DCC circuit 902 is analogous to DCC circuit 502 of FIG. 5 and includes a correction buffer 910, a V/I converter 922, a signal filter 924, a slicer 926, and a duty-cycle calibration engine 928. Operation of each of these elements is described in more detail below.

Correction buffer 910 has a differential transistor pair T1 coupled to a voltage-offset generator (VOG) G1. Differential transistor pair T1 is configured to substantially repeat a differential input signal labeled CLOCK-IN, while VOG G1 is configured to shift the components of the repeated signal with respect to one another to produce a differential output signal labeled CLOCK-OUT. VOG G1 has a pair of current sources labeled IP and IM, which are controlled by a control signal 930 provided by calibration engine 928 at a port labeled DCAL(6:0). Control signal 930 is a 7-bit digital signal, whose value (d) determines the currents, $I_p$ and $I_m$, generated by current sources IP and IM, respectively, in accordance with Eq. (1) as follows:

$$I_p = I_0 + \frac{d}{2} i_{inc} \quad (1a)$$

$$I_m = I_0 - \frac{d}{2} i_{inc} \quad (1b)$$

where $I_0$ is a constant and $i_{inc}$ is an increment amount. A difference between the currents causes correction buffer 910 to generate an offset voltage value of $dv_{inc}$, which serves to offset the components of signal CLOCK-OUT, where $v_{inc} = R i_{inc}$ and R is the resistance of each of the two resistors coupled to differential transistor pair T1.

V/I converter 922 has a differential transistor pair T2, the gates of which are configured to receive signal CLOCK-OUT. The effect of signal CLOCK-OUT on the transistors is such that only one of the transistors is in the "on" state at a time. Consequently, current flowing through each of the transistors alternates between 0 and $I_c$, where $I_c$ is the current generated by a current source labeled IC.

Signal filter 924 has two integrators, each having a transistor coupled to two current sources as shown in FIG. 9. In addition, the source of each transistor is coupled to a corresponding transistor of differential transistor pair T2 in V/I converter 922, while the drain of each transistor is coupled to a corresponding one of two capacitors labeled CINTP and CINTM. Each integrator substantially works by accumulating in the corresponding capacitor (CINTP or CINTM) the amount of charge corresponding to the current flowing through that transistor of differential transistor pair T2, to which the integrator is coupled. Calibration engine 928 provides a control signal (not shown in FIG. 9), which resets capacitors CINTP and CINTM at the beginning of each integration period. As a result, at the end of each integration period, the voltage across each of capacitors CINTP and CINTM is proportional to the integral of the current that passed through the corresponding transistor of differential transistor pair T2 during the integration period. A common-mode feedback (CMFB) circuit coupled to the current sources in the integrators of signal filter 924 serves to adjust common-mode voltages in the signal filter to maximize the filter's dynamic range as known in the art. Representative CMFB circuits that can be used in signal filter 924 are disclosed, for example, in U.S. Pat. Nos. 4,533,876, 4,906,943, and 4,933,644, the teachings of all of which are incorporated herein by reference.

Slicer 926 is a comparator circuit configured to compare the voltages of capacitors CINTP and CINTM at the end of each integration period, which end is indicated by a control signal 936 provided by calibration engine 928 at a port labeled SLICE_CLK. The output of slicer 926 is a binary signal generated, for example, as follows. When the voltage across capacitor CINTP is greater than the voltage across capacitor CINTM, slicer 926 outputs a binary "one". Similarly, when the voltage across capacitor CINTM is greater than the voltage across capacitor CINTP, slicer 926 outputs a binary "zero". The output signal generated by slicer 926 is applied to calibration engine 928 at a port labeled VERROR. Based on that signal, the calibration engine adjusts the value of d provided to correction buffer 910 via control signal 930, thereby changing the duty-cycle value in output signal CLOCK-OUT.

While this invention has been described with reference to illustrative embodiments, this description is not intended to be construed in a limiting sense. For example, circuits of the invention can be used to adjust a clock signal to achieve a duty-cycle value other than 50% for applications other than that in a half-rate clocking system. The clock signal being adjusted may be generated by any appropriate clock-signal generator other than a PLL, e.g., a delay-locked loop (DLL). Various modifications of the described embodiments, as well as other embodiments of the invention, which are apparent to persons skilled in the art to which the invention pertains are deemed to lie within the principle and scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

The present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

What is claimed is:

1. Apparatus having circuitry for changing duty cycle of a first differential clock signal having first and second signal components, the apparatus comprising:
   a buffer circuit adapted to add offset voltage between the first and second signal components; and
   a feedback loop coupled to the buffer circuit and adapted to configure the buffer circuit to generate the offset voltage, which adjusts the duty cycle of the first differential clock signal, wherein:
   the buffer circuit is adapted to add the offset voltage to generate a second differential clock signal, wherein the first differential signal has a first duty-cycle value and the second differential clock signal has a second duty-cycle value;
   the feedback loop is adapted to (i) process the second differential clock signal to evaluate deviation of the second duty-cycle value from a desired duty-cycle value and (ii) based on the evaluation, configure the buffer circuit to generate the offset voltage to change the second duty-cycle value;
   the feedback loop comprises a digital logic circuit coupled to analog circuitry;
   the analog circuitry is adapted to process the second differential clock signal and provide to the digital logic circuit a measure of deviation of the second duty-cycle value from the desired value;
   based on the provided measure, the digital logic circuit is adapted to configure the buffer circuit to generate the offset voltage; and
   the digital logic circuit is further adapted to provide control signals to the analog circuitry for the processing of the second differential signal.

2. The invention of claim 1, wherein the first duty-cycle value deviates from the desired duty-cycle value and the desired duty-cycle value is about 50%.

3. The invention of claim 1, wherein the analog circuitry comprises:
   a voltage-to-current converter adapted to receive the second differential clock signal from the buffer circuit and convert said signal into one or more alternating current signals;

a signal filter adapted to integrate each of the one or more alternating current signals over an integration period to determine a corresponding cumulative signal increment; and a slicer adapted to evaluate each cumulative signal increment to generate the measure of deviation.

4. The invention of claim 3, wherein each of the alternating current signals is a square-wave signal alternating between two constant values.

5. The invention of claim 3, wherein the voltage-to-current converter is implemented using a differential transistor pair.

6. The invention of claim 3, wherein the signal filter includes first and second integrators, each coupled to the voltage-to-current converter, wherein:

the first integrator has a first capacitor adapted to accumulate charge corresponding to a first alternating current signal of the one or more alternating current signals;

the second integrator has a second capacitor adapted to accumulate charge corresponding to a second alternating current signal of the one or more alternating current signals; and the first and second alternating current signals correspond to different components of the second differential signal.

7. The invention of claim 6, wherein the slicer is a comparator adapted to compare voltages corresponding to the first and second capacitors.

8. The invention of claim 3, wherein the digital logic circuit is adapted to:

reset the signal filter at the beginning of the integration period;

configure the slicer to generate the measure of deviation at the end of the integration period; and based on the measure of deviation, generate a control signal which determines the offset voltage generated by the buffer circuit.

9. The invention of claim 8, wherein the control signal is a digital signal representing the offset voltage.

10. The invention of claim 1, wherein the apparatus is adapted to dynamically change the offset voltage to accommodate fluctuations in the first duty-cycle value.

11. The invention of claim 1, wherein the second differential clock signal is a clock signal for a half-rate clocking system.

12. The invention of claim 1, wherein the apparatus comprises a clock-signal generator adapted to generate the first differential clock signal.

13. The invention of claim 12, wherein the clock-signal generator is a phase-locked loop.

14. A method for changing duty cycle of a first differential clock signal having first and second signal components, the method comprising:

adding offset voltage between the first and second signal components;

generating the offset voltage, which adjusts the duty cycle of the first differential clock signal;

adding the offset voltage to generate a second differential clock signal, wherein the first differential clock signal has a first duty-cycle value and the second differential signal has a second duty-cycle value;

processing the second differential clock signal to evaluate deviation of the second duty-cycle value from a desired duty-cycle value; and based on the evaluation, generating the offset voltage to change the second duty-cycle value, wherein the second differential clock signal is processed in a feedback loop having a digital logic circuit coupled to analog circuitry, wherein:

the analog circuitry is adapted to process the second differential clock signal and provide to the digital logic circuit a measure of deviation of the second duty-cycle value from the desired value; and based on the provided measure, the digital logic circuit is adapted to configure the buffer circuit to generate the offset voltage; and processing the second differential clock signal comprises:

converting the second differential clock signal into one or more alternating current signals in a voltage-to-current converter;

integrating each of the one or more alternating current signals over an integration period in a signal filter to determine a corresponding cumulative signal increment; and evaluating each cumulative signal increment in a slicer to generate the measure of deviation.

15. The invention of claim 14, further comprising dynamically changing the offset voltage to accommodate fluctuations in the first duty-cycle value.

16. Apparatus having circuitry for changing duty cycle of a first differential clock signal having first and second signal components, the apparatus comprising:

a buffer circuit adapted to add offset voltage between the first and second signal components; and a feedback loop coupled to the buffer circuit and adapted to configure the buffer circuit to generate the offset voltage, which adjusts the duty cycle of the first differential clock signal, wherein:

the buffer circuit is adapted to add the offset voltage to generate a second differential clock signal, wherein the first differential signal has a first duty-cycle value and the second differential clock signal has a second duty-cycle value;

the feedback loop is adapted to (i) process the second differential clock signal to evaluate deviation of the second duty-cycle value from a desired duty-cycle value and (ii) based on the evaluation, configure the buffer circuit to generate the offset voltage to change the second duty-cycle value;

the feedback loop comprises a digital logic circuit coupled to analog circuitry;

the analog circuitry is adapted to process the second differential clock signal and provide to the digital logic circuit a measure of deviation of the second duty-cycle value from the desired value;

based on the provided measure, the digital logic circuit is adapted to configure the buffer circuit to generate the offset voltage; and the analog circuitry comprises:

a voltage-to-current converter adapted to receive the second differential clock signal from the buffer circuit and convert said signal into one or more alternating current signals;

a signal filter adapted to integrate each of the one or more alternating current signals over an integration period to determine a corresponding cumulative signal increment; and a slicer adapted to evaluate each cumulative signal increment to generate the measure of deviation.

17. The invention of claim 16, wherein each of the alternating current signals is a square-wave signal alternating between two constant values.

18. The invention of claim 16, wherein the voltage-to-current converter is implemented using a differential transistor pair.

19. The invention of claim 16, wherein the signal filter includes first and second integrators, each coupled to the voltage-to-current converter, wherein:
- the first integrator has a first capacitor adapted to accumulate charge corresponding to a first alternating current signal of the one or more alternating current signals;
- the second integrator has a second capacitor adapted to accumulate charge corresponding to a second alternating current signal of the one or more alternating current signals; and
- the first and second alternating current signals correspond to different components of the second differential clock signal.

20. The invention of claim 19, wherein the slicer is a comparator adapted to compare voltages corresponding to the first and second capacitors.

21. The invention of claim 16, wherein the digital logic circuit is adapted to:
- reset the signal filter at the beginning of the integration period;
- configure the slicer to generate the measure of deviation at the end of the integration period; and
- based on the measure of deviation, generate a control signal which determines the offset voltage generated by the buffer circuit.

22. The invention of claim 21, wherein the control signal is a digital signal representing the offset voltage.

* * * * *